United States Patent
Nishimura et al.

(10) Patent No.: US 7,535,302 B2
(45) Date of Patent: May 19, 2009

(54) OPERATIONAL AMPLIFIER AND DISPLAY DEVICE

(75) Inventors: Kouichi Nishimura, Kanagawa (JP); Atsushi Shimatani, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 14 days.

(21) Appl. No.: 11/976,751

(22) Filed: Oct. 26, 2007

(65) Prior Publication Data
US 2008/0100380 A1 May 1, 2008

(30) Foreign Application Priority Data
Oct. 27, 2006 (JP) ............................. 2006-293182

(51) Int. Cl.
*H03F 3/45* (2006.01)
(52) U.S. Cl. .............................. 330/255; 330/9; 330/261
(58) Field of Classification Search ................. 330/255, 330/257, 260, 261, 258, 9, 51
See application file for complete search history.

(56) References Cited

U.S. PATENT DOCUMENTS

| | | | | |
|---|---|---|---|---|
| 5,907,259 A | * | 5/1999 | Yamada et al. .............. | 327/563 |
| 6,384,683 B1 | * | 5/2002 | Lin .............................. | 330/257 |
| 7,057,459 B2 | * | 6/2006 | Ueno .......................... | 330/255 |
| 7,187,235 B2 | * | 3/2007 | Moon .......................... | 330/255 |
| 7,330,074 B2 | * | 2/2008 | Kang et al. .................. | 330/255 |

FOREIGN PATENT DOCUMENTS

JP 11-249623 9/1999

* cited by examiner

*Primary Examiner*—Henry K Choe
(74) *Attorney, Agent, or Firm*—McGinn IP Law Group, PLLC

(57) ABSTRACT

To reduce the apparent effect of offset voltage by making the offset voltage spatially scattered. An operational amplifier 1 includes: a first differential pair having N-channel MOS transistors MN1 and MN2; a second differential pair having P-channel MOS transistors MP1 and MP2; an output stage having output transistors NP3 and MN3; first and second active loads 11 and 12 having a switch, adapted to convert differential outputs from the first and second differential pairs to a single output, respectively; first and second bias circuits 13 and 14 having a switch, adapted to select one of two outputs of each of the first and second active loads 11 and 12 having the switch and to determine idling current of the MP3 and MN3, respectively; first and second switches SW1 and SW2 adapted to respectively connect an output terminal and an input terminal to one of the gates of each of the first and second differential pairs; and a terminal 17 adapted to receive an offset cancellation signal for controlling switching functions and the switches in linkage with each other.

13 Claims, 9 Drawing Sheets

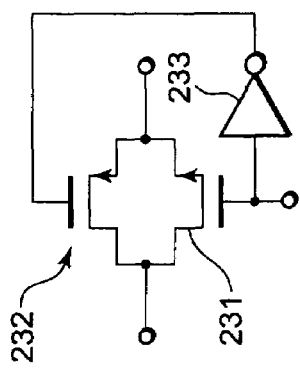
FIG. 3(D)
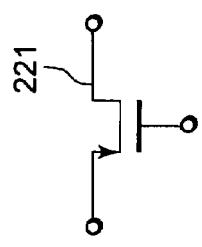
FIG. 3(C)
FIG. 3(B)
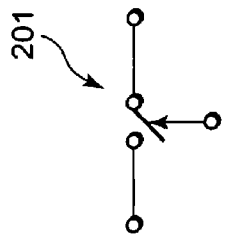
FIG. 3(A)
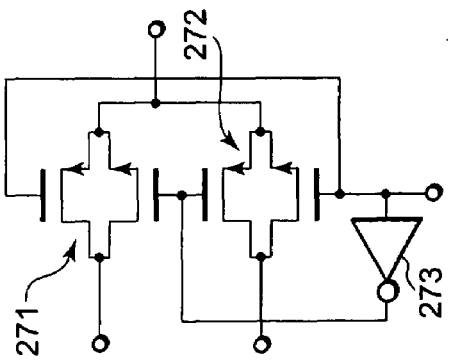
FIG. 3(H)
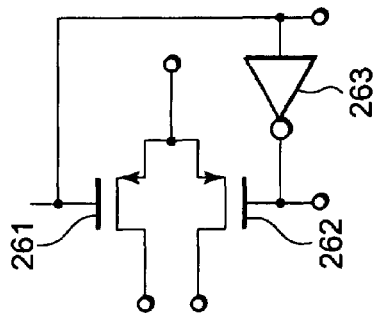
FIG. 3(G)
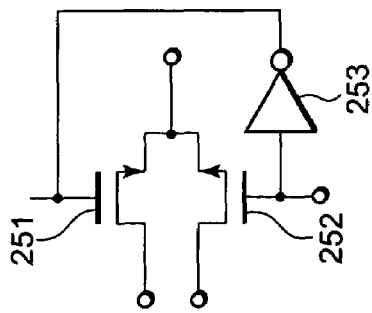
FIG. 3(F)
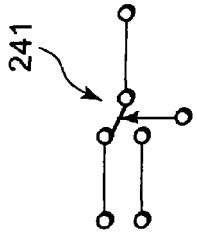
FIG. 3(E)

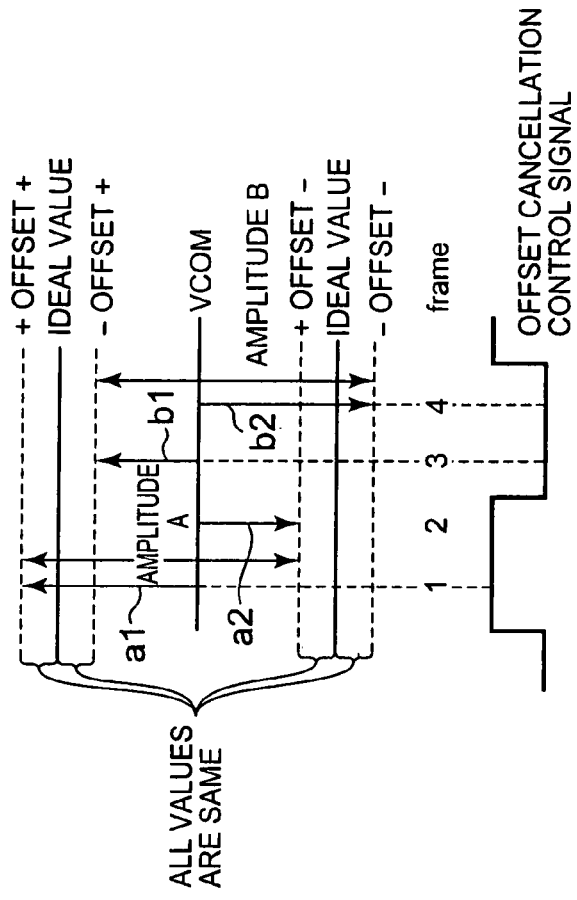
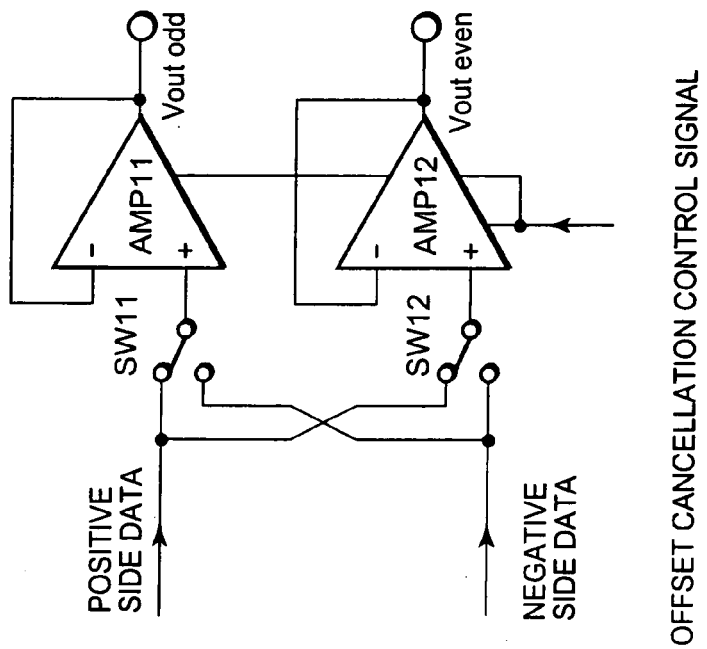

OPERATIONAL AMPLIFIER AND DISPLAY DEVICE

BACKGROUND OF THE INVENTION

1. Field of the Invention

The present invention relates to an operational amplifier suitable for an output buffer amplifier for an LCD (Liquid Crystal Display) driver used to drive a capacitive load such as a liquid crystal panel, and for a gradation power source circuit adapted to determine gamma correction. The present invention also relates to a display device using the operational amplifier.

2. Description of the Related Art

Conventionally, a so-called operational amplifier is generally constituted by bipolar transistors. In recent years, however, the operational amplifier has also been constituted by MOS transistors in more cases according to the need to be provided together with a MOS circuit and the request for low power. In order to constitute the operational amplifier by MOS transistors, a circuit constitution different from the operational amplifier constituted by bipolar transistors may be adopted by using analog characteristics particular to the MOS transistor. For example, there is an amplifier using an electronic switch function, and the like.

As one of the application fields of the operational amplifier constituted by MOS transistors, there is a TFT_LCD (Thin Film Transistor Liquid Crystal Display) driver LSI. The LCD driver LSI includes a plurality of operational amplifiers of voltage follower constitution as an output buffer amplifier and a gradation power source for gamma correction, and particularly needs to have a small offset voltage difference between the plurality of operational amplifiers. This is because even a voltage difference of 10 mV is recognized as a different gradation by the human eye due to the characteristics of the TFT_LCD. Thus, a MOS operational amplifier having a very small offset voltage is required in this field.

FIG. 6 and FIG. 7 are circuit diagrams showing an operational amplifier applied to drive a conventional video display device (see, for example, Japanese Patent Laid-Open No. 11-249623). As shown in FIG. 6, the conventional operational amplifier is constituted by two P-channel MOS transistors MP101 and MP102, constant current sources I101, I102, N-channel MOS transistors MN101, MN102 and MN103, a phase compensation capacitance C101, and switches S101 to S108.

The two P channel MOS transistors MP101 and MP102 constitute a differential pair. The constant current source I101 biases the differential pair and is inserted between the commonly connected sources of the P channel MOS transistors MP101 and MP102, and a positive power source VDD. The N-channel MOS transistors MN101 and MN102 serve as active loads and constitute a current mirror which converts differential signals to a single output. The N-channel MOS transistor MN103 constitutes a second stage amplifier circuit. The constant current source I102 operates as an active load of the N-channel MOS transistor MN103, and is inserted between the positive power source VDD and the drain of the N-channel MOS transistor MN103. The phase compensation capacitance C101 is inserted between the gate and drain of the N-channel MOS transistor MN103.

Further, the switch S101 is a break type switch inserted between the gate and drain of the N-channel MOS transistor MN101. The switch S102 is a make type switch inserted between the gate and drain of the N-channel MOS transistor MN102. Here, the break type switch means a switch which opens (turns off) when a control signal is input. Further, the make type switch means a switch which closes (turns on) when a control signal is input.

The switch S103 is a make type switch connected between the drain of the N-channel MOS transistor MN101 and the gate of the N-channel MOS transistor MN103. The switch S104 is a break type switch connected between the drain of the N-channel MOS transistor MN102 and the gate of the N-channel MOS transistor MN103. The switch S105 is a make type switch connected between the gate of the P-channel MOS transistor MP102 and an output terminal Vout. The switch S106 is a break type switch connected between the gate of the P-channel MOS transistor MP101 and the output terminal Vout. The switch S107 is a make type switch connected between the gate of the P-channel MOS transistor MP101 and a noninverting input terminal Vin. The switch S108 is a break type switch connected between the gate of the P-channel MOS transistor MP102 and the noninverting input terminal Vin.

The drain of the P-channel MOS transistor MP101 which is one of the P-channel MOS transistors constituting the differential pair is connected to the drain of the N-channel MOS transistor MN101, while the drain of the P-channel MOS transistor MP102 which is the other of the P-channel MOS transistors constituting the differential pair is connected to the drain of the N-channel MOS transistor MN102. Then, all the switches S101 to S108 are controlled in linkage with each other. Further, as will be described below, the amplifier in FIG. 6 is used in an odd frame, and is characterized in that the switches are switched in 4n-1 frame and 4n-3 frame where n is a natural number starting from 1. The state of the switches at the time of 4n-1 frame is shown in the right figure in FIG. 6, and the state of the switches at the time of 4n-3 frame is shown in the left figure in FIG. 6.

Further, as shown in FIG. 7, another conventional operational amplifier is constituted by two N-channel MOS transistors MN201, MN202, a constant current sources I201, P-channel MOS transistors MP201, MP202 and NP203, a constant current sources I202, a phase compensation capacitance C201, and switches S201 to S208.

The two N-channel MOS transistors MN201 and MN202 constitute a differential pair. The constant current source I201 biases the differential pair, and is inserted between the commonly connected sources of the N-channel MOS transistors MN201 and MN202 and a negative power source VSS. The P-channel MOS transistors MP201 and MP202 serve as active loads and constitute a current mirror which converts differential signals to a single output. The P-channel MOS transistor NP203 constitutes a second stage amplifier circuit. The constant current source I202 operates as an active load of the P-channel MOS transistor MP203, and is inserted between the negative power source VSS and the drain of the P-channel MOS transistor MP203. The phase compensation capacitance C201 is inserted between the gate and drain of the P-channel MOS transistor MP203.

Further, the switch S201 is a break type switch inserted between the gate and drain of the P-channel MOS transistor MP201. The switch S202 is a make type switch inserted between the gate and drain of the P-channel MOS transistor MP202. The switch S203 is a make type switch connected between the drain of the P-channel MOS transistor MP201 and the gate of the P-channel MOS transistor MP203. The switch S204 is a break type switch connected between the drain of the P-channel MOS transistor MP202 and the gate of the P-channel MOS transistor MP203. The switch S205 is a break type switch connected between the gate of the N-channel MOS transistor MN202 and an output terminal Vout. The switch S206 is a break type switch connected between the gate of the N-channel MOS transistor MN201 and the output terminal Vout. The switch S207 is a break type switch connected between the gate of the N-channel MOS transistor MN201 and a noninverting input terminal Vin. The switch S208 is a make type switch connected between the gate of the N-channel MOS transistor MN202 and the noninverting input terminal Vin.

Then, the drain of the N-channel MOS transistor MN201 which is one of the N-channel MOS transistors constituting the differential pair is connected to the drain of the P-channel MOS transistor MP201. The drain of the N-channel MOS transistor MN202 which is the other of the N-channel MOS transistors constituting the differential pair is connected to the drain of the P-channel MOS transistor MP202. Then, all the switches S201 to S208 are controlled in linkage with each other. Further, as will be described below, the amplifier in FIG. 7 is used in an even frame, and is characterized in that the switches are switched in 4n−2 frame and 4n frame where n is a natural number starting from 1. The state of the switches at the time of 4n frame is shown in the right figure in FIG. 7, and the state of the switches at the time of 4n−2 frame is shown in the left figure in FIG. 7.

Next, there is shown in FIG. 8 an application example in the case where the amplifiers shown in FIG. 6 and FIG. 7 are applied to an LCD driver. As shown in FIG. 8, the amplifier shown in FIG. 7 is applied to an AMP101, and the amplifier shown in FIG. 6 is applied to an AMP102. Then, the transfer type switches (SW101 and SW102) are respectively provided for the outputs of the amplifiers AMP101 and AMP102. The outputs of the amplifier AMP101 and the amplifier AMP102 are switched for an odd-numbered (Vout odd) output and an even-numbered (Vout even) output, respectively. When a certain state is taken at this time, the output of the amplifier AMP101 is output at the odd-numbered order, and the output of amplifier AMP102 is output at the even-numbered order. Another state is opposite to the certain state. At this time, the output of the amplifier AMP101 is output at the even-numbered order, and the output of amplifier AMP102 is output at the odd-numbered order. Then, positive side data are input to the input of the amplifier AMP101, and negative side data are input to the input of the amplifier AMP102. When the switches SW101 and SW102 connected in this manner are operated in linkage with each other for each frame, an output image as shown in the right figure in FIG. 8 is obtained. Note that in a driving system referred to as dot inversion driving, the SW101 and SW102 are switched for each horizontal period. Here, the detailed description of the driving system is omitted.

Next, an operation of the conventional operational amplifier will be described. The conventional operational amplifier shown in FIG. 6 includes the P-channel MOS transistors MP101 and MP102 constituting the differential pair, and the N-channel MOS transistors MN101 and MN102 of a current mirror constitution which serve as an active load of the differential pair and have a differential to single-end conversion function. Here, when the switch S101 is closed, the drain of the N-channel MOS transistor MN102 serves as a single end output, and when the switch S102 is closed, the drain of N-channel MOS transistor MN101 serves as a single end output.

The output terminal is changed by the states of the switch S101 and the switch S102 in this way, and hence the switch S103 and the switch S104 are provided for the selection of the outputs. A signal subjected to the single conversion is inputted into the gate of the N-channel MOS transistor MN103 constituting the output transistor, through the switch S103 and the switch S104. At this time, the constant current source I102 operates as an active load of the N-channel MOS transistor MN103. Then, the drain of the N-channel MOS transistor MN103 serves as the output terminal Vout.

The capacitance C101 performs a function of phase compensation as a mirror capacity. The operational amplifier is subjected to so-called voltage follower connection in which an inverting input terminal and the output terminal Vout are commonly connected, in order to be used as a buffer amplifier. The voltage follower connection is a system in which the inverting input terminal and the output terminal of the AMP are connected in common, an input signal is input into the noninverting input terminal, and an output having the same voltage as the input voltage is output from the output terminal of the AMP.

When the switches S101 to S104 are switched, the gate of the P-channel MOS transistor MP101 or the gate of the P-channel MOS transistor MP102 can be used as the inverting input terminal. Therefore, the switch S105 and the switch S106 are provided in order to switch the input terminal. That is, as shown in the left figure in FIG. 6, when the switch S101 and the switch S104 are closed, the gate terminal of the P-channel MOS transistor MP101 is used as the inverting input terminal. Therefore, when the switch S106 is closed at this time, the inverting input terminal and the output terminal Vout are connected in common so as to effect the voltage-follower connection. Thus, the gate terminal of the P-channel MOS transistor MP102 serves as the noninverting input terminal Vin, and hence is connected to the noninverting input terminal Vin by closing the switch S108.

On the contrary, as shown in the right figure in FIG. 6, when the switch S102 and the switch S103 are closed, the gate terminal of the P-channel MOS transistor MP102 serves as the inverting input terminal. Therefore, when the switch S105 is closed at this time, the inverting input terminal and the output terminal Vout are connected in common, so as to effect voltage-follower connection. The gate terminal of the P-chain channel MOS transistor MP101 serves as the noninverting input terminal Vin, and hence is connected to the noninverting input terminal Vin by closing the switch S107. The two states are made to exist by the switching of the switches S101 to S108. The two states are switched by the 4n−3 frame and the 4n−1 frame, as described above. Assuming that an offset voltage +Vos is generated in the conventional operational amplifier shown in FIG. 6, when the switches S101 to S108 are switched, the offset voltage becomes −Vos at this time. Thus, the offset is spatially scattered by switching the switches S101 to S108 at the 4n−3 frame and the 4n−1 frame, so that the offset voltage becomes zero when averaged. Therefore, the offset voltage is recognized as the averaged voltage, that is, zero by the human eye. In other words, this system is a technique of deceiving the human eye.

The amplifier shown in FIG. 6 has a differential stage constituted by the P-channel, and hence a voltage greater than or equal to about VDD−1V cannot be input as the input at the side of the positive power source VDD. This is because the bias current source I101 is made to be inoperative by the gate-source voltage of the P-channel MOS transistors MP101 and MP102 of the differential stage. However, depending upon the gate-source voltage of the N-channel MOS transistors MN101 and MN102 as the active load, a voltage up to almost VSS can be input in a range close to VSS.

The conventional operational amplifier shown in FIG. 7 includes the N-channel MOS transistors MN201 and MN202 constituting the differential pair, and the P-channel MOS transistors MP201 and MP202 of a current mirror constitution which serve as an active load and have a differential to single end conversion function. Here, when the switch S201 is closed, the drain of the P-channel MOS transistor MP202 serves as a single end output, while when the switch S102 is closed, the drain of the P-channel MOS transistor MP201 serves as a single end output.

Since the output terminal is changed by the states of the switch S201 and the switch S202, the switch 5203 and the switch S204 are provided for the selection of the outputs. A signal subjected to the single conversion is input into the gate of the P-channel MOS transistor MP203 serving as the output transistor, through the switch S203 and the switch S204. At this time, the constant current source I202 operates as an active load of the P-channel MOS transistor MP203. Thus, the drain of the P-channel MOS transistor MP203 serves as the output terminal Vout. The capacitance C201 performs a function of phase compensation as a mirror capacity. The operational amplifier is subjected to so-called voltage follower connection in which an inverting input terminal and the output terminal Vout are commonly connected, in order to be used as a buffer amplifier.

Here, when the switches S201 to S204 are switched, the gate of the N-channel MOS transistor MN201 or the gate of the N-channel MOS transistor MN202 serves as the inverting input terminal. Therefore, the switch S205 and the switch S206 are provided in order to switch the gates of the N-channel MOS transistors. That is, as shown in the left figure in FIG. 7, when the switch S201 and the switch S204 are closed, the gate terminal of the N-channel MOS transistor MN201 serves as the inverting input terminal. Therefore, when the switch S206 is closed at this time, the inverting input terminal and the output terminal Vout are connected in common so as to effect the voltage-follower connection.

Thus, the gate terminal of the N-channel MOS transistor MN202 serves as the noninverting input terminal Vin, and hence is connected to the noninverting input terminal Vin by closing the switch S208. On the contrary, as shown in the right figure in FIG. 7, when the switch S202 and the switch S203 are closed, the gate terminal of the N-channel MOS transistor MN202 serves as the inverting input terminal. Therefore, when the switch S205 is closed at this time, the inverting input terminal and the output terminal Vout are connected in common so as to effect the voltage-follower connection. Thus, the gate terminal of the N-channel MOS transistor MN201 serves as the noninverting input terminal Vin, and hence is connected to the noninverting input terminal Vin by closing the switch S207. The two states are made to exist by the switching of the switches S201 to S208. The two states are switched by 4n−2 frame and 4n frame, as described above. Assuming that an offset voltage +Vos is generated in the conventional operational amplifier shown in FIG. 7, when the switches S201 to S208 are switched, the offset voltage becomes −Vos at this time.

Similarly to the case shown in FIG. 6, the offset is spatially scattered by switching the switches S201 to S208 by 4n−2 frame and 4n frame, so that the offset voltage becomes zero when averaged. Therefore, the offset voltage is recognized as the averaged voltage, that is, zero by the human eye.

The operational amplifier shown in FIG. 7 has a differential stage constituted by the N-channel, and hence a voltage less than or equal to about VSS+1 V cannot be input as the input at the side of the negative power source. This is because the bias current source 1201 is made to be inoperative by the gate-source voltage of the MOS transistors MN201 and MN202 of the differential stage. However, depending upon the gate-source voltage of the P-channel MOS transistors MP201 and MP202 as the active load, a voltage up to almost VDD can be input in a range close to VDD.

FIG. 8 shows an application example in the case where the operational amplifier shown in FIG. 7 is used as the positive side (VDD/2 to VDD) amplifier of an LCD driver, and the operational amplifier shown in FIG. 6 is used as the negative side (VSS to VDD/2) amplifier of the LCD driver. As shown in FIG. 8(A), in the amplifier AMP101, the operational amplifier shown in FIG. 7 is used as the amplifier dedicated for the positive side, while in the amplifier AMP102, the operational amplifier shown in FIG. 6 is used as the amplifier dedicated for the negative side. Then, each of the amplifiers is provided with a switching output so as to be able to output each of an odd-numbered output (Vout_odd) and an even-numbered output (Vout_even). This makes it possible to output both voltages of a positive side voltage and a negative side voltage for each of the odd-numbered output and the even-numbered output. This is the so-called conventional two AMP system.

Here, the driving method of LCD driver referred to as dot inversion driving is a driving method configured to alternately output the positive side (+) polarity and the negative side (−) polarity for each dot on the basis of VCOM. Further, it is necessary to invert the polarity for each frame. Therefore, in order to perform the offset cancellation on the basis of the frame signal, the driving method is configured to use four frames as one set, as shown in FIG. 8(B). That is, when the positive side (+) polarity is output by the amplifier AMP101 in the first frame, the negative side (−) polarity is output by the amplifier AMP102 in the second frame. At this time, it is assumed that the offset cancellation signal is not changed in the first frame and the second frame.

Then, in the third frame, the offset cancellation signal is inverted and the positive side (+) polarity is made to be output by the amplifier AMP101. In the fourth frame, the offset cancellation signal is made to remain in the inverted state and the negative side (−) polarity is made to be output by the amplifier AMP102. Here, the image quality is influenced by the sum of absolute values of the positive side (+) amplitude and the negative side (−) amplitude. When the differences in the amplitude A and the amplitude B shown in FIG. 7(B) are the same, the images are recognized to have the same gradation. Therefore, when the absolute values of the offset voltage based on the offset cancellation control signal are the same in each of the positive side and the negative side before and after the control of the offset cancellation control signal, the amplitude A and the amplitude B consequently become the same value. In this way the offset cancellation can be effected. Here, the difference between the amplitude A and the amplitude B is referred to as an amplitude difference deviation. The amplitude difference deviation is a most important item in the LCD driver. If the amplitude difference deviation is large, there arise a problem that vertical stripes are caused in the LCD display.

However, when the LCD driver shown in FIG. 8 is constituted by making the operational amplifier shown in FIG. 6 dedicated for the negative side and making the operational amplifier shown in FIG. 7 dedicated for the positive side, the positive side and the negative side are constituted by separate operational amplifiers, which naturally results in different offset voltages in the positive side and the negative side. Further, even when the offset cancellation is applied, the offset voltage cannot be made to zero. Therefore, offset voltage differences are respectively caused even after the offset cancellation is applied, which results in the amplitude difference deviation. That is, the conventional method has a system constitution in which the amplitude difference deviation is intrinsically caused, which makes it impossible to expect the amplitude difference deviation characteristic to be improved to some extent or more. Therefore, the amplitude difference deviation is increased to cause a problem that vertical stripes are generated in the LCD display.

Further, the conventional operational-amplifier is not capable of coping with the driving method referred to as 2H inversion driving. The 2H inversion driving is a method for continuously driving the positive side voltage or the negative side voltage during two horizontal periods. FIG. 9 shows the output drive of the 2H inversion driving method.

The operational amplifier shown in FIG. 6 has at most only a current discharging capability for the current source I102, and the operational amplifier shown in FIG. 7 has at most only a current sucking capability for the current source I202. When the current discharging capability and the current sucking capability can be obtained at most only for the current source I102 and I202, the conventional operational amplifier is unable to cope with the 2H inversion driving method. Note that depending upon the size of the N-channel MOS transistor MN3 and the P-channel MOS transistor MP203, the current sucking capability of the operational amplifier shown in FIG. 6 and the current discharging capability of the amplifier shown in FIG. 7 can be increased to a certain level.

The reason why the 2H inversion driving method cannot be coped with when the drive current discharging capability of the operational amplifier shown in FIG. 6 and the current sucking capability of the operational amplifier shown in FIG. 7 are small, is that there arises no problem because the operational amplifier in FIG. 7 performs a current discharging operation in the rising waveform of 1H, but when the voltage of the second H is lower than the voltage of the first H, the operation to suck the drive current is performed to cause the drive current to be insufficient.

SUMMARY OF THE INVENTION

The operational amplifier according to the present invention includes: a first differential pair having a first transistor and a second transistor which are a first conductivity type; a second differential pair having a third transistor and a fourth transistor which are a second conductivity type; an output stage having a fifth transistor and a sixth transistor; a first active load having a switch, adapted to convert differential outputs from the first differential pair to a single output; a second active load having a switch, adapted to convert differential outputs from the second differential pair to a single output; a first bias circuit having a switch, adapted to select one of two outputs of the first active load having the switch and to determine idling current of the fifth transistor; a second bias circuit having a switch, adapted to select one of two outputs of the second active load having the switch and to determine idling current of the sixth transistor; a first switch adapted to connect an output terminal to one of control terminals of each of the first and second differential pairs; a second switch adapted to connect an input terminal to one of control terminals of each of the first and second differential pairs; and a control signal terminal adapted to receive a control signal for controlling switching functions in the first and second active loads having the switch, switching functions in the first and second bias circuits having the switch, and the first and second switches in linkage with each other.

A display device according to the present invention includes: a first operational amplifier connected to an odd-numbered output; a second operational amplifier connected to an even-numbered output and adapted to receive an offset cancellation signal common to the first operational amplifier; a first transfer type switch, the common terminal side of which is connected to a noninverting input terminal of the first operational amplifier, and which is adapted to select whether to receive an output voltage from a positive side digital-to-analog converter or an output voltage from a negative side digital-to-analog converter; and a second transfer type switch, the common terminal side of which is connected to a noninverting input terminal of the second operational amplifier, and which is adapted to select whether to receive an output voltage from a positive side digital-to-analog converter or an output voltage from a negative side digital-to-analog converter, the first and second operational amplifiers each including: a first differential pair having a first transistor and a second transistor which are a first conductivity type; a second differential pair having a third transistor and a fourth transistor which are a second conductivity type; an output stage having a fifth transistor and a sixth transistor; a first active load having a switch, adapted to convert differential outputs from the first differential pair to a single output; a second active load having a switch, adapted to convert differential outputs from the second differential pair to a single output; a first bias circuit having a switch, adapted to select one of two outputs of the first active load having the switch and to determine idling current of the fifth transistor; a second bias circuit having a switch, adapted to select one of two outputs of the second active load having the switch and to determine idling current of the sixth transistor; a first switch adapted to connect an output terminal to one of control terminals of each of the first and second differential pairs; a second switch adapted to connect an input terminal to one of control terminals of each of the first and second differential pairs; and a control signal terminal adapted to receive an offset cancellation signal for controlling switching functions in the first and second active loads having the switch, switching functions in the first and second bias circuits having the switch, and the first and second switches in linkage with each other.

In the present invention, there are provided the second switch for switching the noninverting input and the inverting input of the first and second differential pairs, and the switching function configured to switch input and output of the active load of the first differential pair and to switch input and output of the active load of the second differential pair, and the first switch for constituting a feedback loop in which the inverted input terminal is connected with the output terminal to constitute the voltage follower, so that it is possible to cancel the offset voltage in the time average by controlling these functions and switches in linkage with each other. Further, by applying the operational amplifier to a liquid crystal display device, it is possible to remarkably improve the characteristics determined by the offset voltage referred to as the deviation.

According to the present invention, it is possible to provide an operational amplifier capable of reducing the apparent effect of the offset voltage by making the offset voltage spatially scattered, and a display device to which the operational amplifier is applied.

BRIEF DESCRIPTION OF THE DRAWINGS

FIG. 3(A) shows a switch, and FIG. 3(B) to FIG. 3(D) show specific examples of the switch shown in FIG. 3(A);

FIG. 3(E) shows another switch, and FIG. 3(F) to FIG. 3(H) show specific examples of the switch shown in FIG. 3(E);

FIG. 4(A) shows an output amplifier of a liquid crystal driver of a liquid crystal display device according to Embodiment 3 of the present invention;

FIG. 4(B) is a figure for explaining the operation of the output amplifier;

DETAILED DESCRIPTION OF THE PREFERRED EMBODIMENTS

In the following, specific embodiments to which the present invention is applied will be described in more detail with reference to the accompanying drawings. The embodiments include an operational amplifier in which the present invention is particularly applied in a simple circuit constitution to an LCD driver which is a typical LSI in the field of video, and which has an offset canceling function configured to reduce an apparent effect of offset voltage by making the offset voltage spatially scattered, and also includes a device constituted by applying the operational amplifier to an output drive amplifier of a display device, such as the LCD driver.

Embodiment 1

Figure 1:
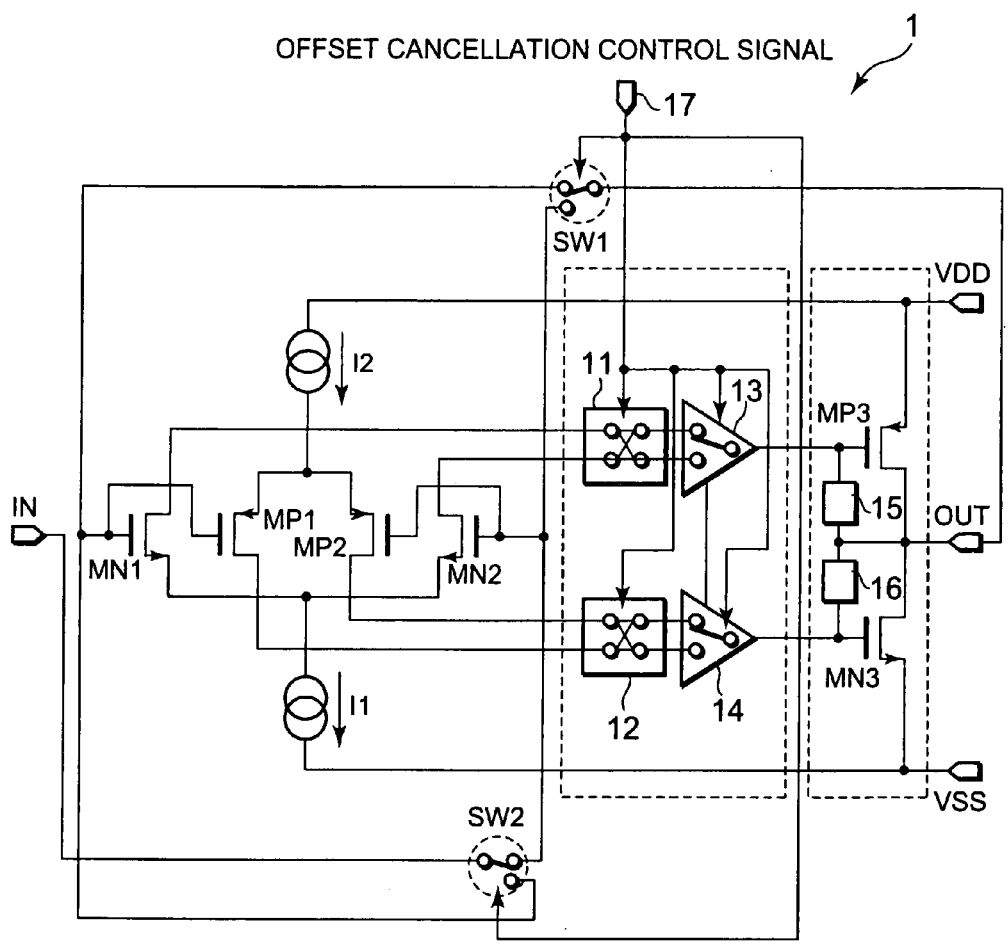
FIG. 1 is a block diagram showing an operational amplifier having an offset cancel circuit according to Embodiment 1 of the present invention.

FIG. 1 is a block diagram showing an operational amplifier having an offset cancel circuit according to Embodiment 1 of the present invention. As shown in FIG. 1, an operational amplifier 1 having an offset cancel circuit according to the present embodiment includes: differential pair MOS transistors (MN1 and MN2) as first and second transistors constituted by N-channel; differential pair MOS transistor (MP1 and MP2) as third and fourth transistors constituted by P-channel; a first constant current source I1; a second constant current source I2; a first active load 11 having a switch; a second active load 12 having a switch; a first bias circuit 13 having a switch; a second bias circuit 14 having a switch; a P-channel MOS output transistor MP3 as a fifth transistor; a N-channel MOS output transistor MN3 as a sixth transistor; a first switch SW1; a second switch SW2; a first phase compensation circuit 15; a second phase compensation circuit 16; and an offset cancellation control signal terminal 17.

The gates of the differential pair MOS transistors MP1 and MP2 are respectively connected in parallel with the gates of differential pair MOS transistors MN1 and MN2 constituted by N-channel transistors. The constant current source I1 is connected between the common source terminal of the N-channel differential pair MOS transistors MN1 and MN2 and a negative supply voltage VSS. The constant current source I2 is connected between the common source of the P-channel differential pair MOS transistors MP1 and MP2 and a positive supply voltage VDD.

The first active load 11 having the switch receives drain outputs of the N-channel differential pair MOS transistors MN1 and MN2, and has the switch for switching input and output. The second active load 12 having the switch receives drain outputs of the P-channel differential pair MOS transistors MP1 and MP2, and has the switch for switching the input and output.

The first bias circuit 13 having the switch has a switch function of selecting one of two outputs of the first active load 11 having the switch and determines an idling current of the P-channel MOS output transistor MP3 as will be described below. The second bias circuit 14 having the switch has a switch function of selecting one of two outputs of the second active load 12 having the switch and determines an idling current of the N-channel MOS output transistor MN3 as will be described below.

In the P-channel MOS output transistor MP3, the gate is connected to the output of the first bias circuit 13 having the switch, the source is connected to the positive power supply VDD, and the drain is connected to an output terminal OUT. In the N-channel MOS output transistor MN3, the gate is connected to the output of the second bias circuit 14 having the switch, the source is connected to the negative power supply VSS, and the drain is connected to the output terminal OUT.

The first switch SW1 switches the connection from the output terminal OUT to one of the two gate inputs of the differential pair transistors. The second switch SW2 switches the connection from the input terminal IN to one of the two gates of the differential pair transistors. The first phase compensation circuit 15 is connected between the gate and drain of the P-channel MOS output transistor MP3. The second phase compensation circuit 16 is connected between the gate and drain of the N-channel MOS output transistor MN3.

The offset cancellation control signal terminal 17 is a terminal adapted to receive an offset cancellation control signal for controlling the switching function in the first active load 11 having the switch and the second active load 12 having the switch, the switching function in the first bias circuit 13 having the switch and the second bias circuit 14 having the switch, and the switch SW1 and the switch SW2, in linkage with each other.

Next, an operation of the operational amplifier 1 according to the present embodiment is described. In FIG. 1, all of the switches of the first switch SW1, the second switch SW2, the switch of the first active load 11 having the switch, the switch of the first bias circuit 13 having the switch, the switch of the second active load 12 having the switch, and the switch of the second bias circuit 14 having the switch are simultaneously driven in linkage with each other.

Here, the switch control of the switch SW1 and the switch SW2 is performed so as to make the operational amplifier 1 negatively fed back. That is, the inverting input of the operational amplifier 1 and the output terminal OUT are connected in common to effect the feedback. The P-channel MOS transistor differential stage constituted by the P-channel MOS transistor MP1 and the P-channel MOS transistor MP2 operates in an input voltage range from VSS to about VDD−1V. This is because, as described above, the bias current source I2 is made inoperable by the gate-source voltage of the differential stage P-channel MOS transistors MP1 and MP2.

Further, the N-channel MOS transistor differential stage constituted by the N-channel MOS transistor MN1 and the N-channel MOS transistor MN2 operates in an input voltage range from VDD to about VSS+1 V. This is because, as described above, the bias current source I1 is made inoperable by the gate-source voltage of the differential stage MOS transistors MN1 and MP2.

In this way, in the operational amplifier 1 shown in FIG. 1, the circuit is constituted in such a manner that in the input voltage range close to VSS, that is, from VSS to about VSS+1 V, only the differential stage constituted by the P-channel MOS transistors (MP1 and MP2) is operated, that in the intermediate voltage range from about VSS+1 V to about VDD−1 V, both the differential stage constituted by the P-channel MOS transistors (MP1 and MP2) and the differential stage constituted by N-channel MOS transistors (MN1 and MN2) are operated, and that in the voltage range from about VDD−1 V to VDD, only the differential stage constituted by the N-channel MOS transistors (MN1 and MN2) is operated. As a result, the amplifier is able to operate in the whole input voltage range from VSS to VDD. Further, each drain of the P-channel MOS transistor MP3 and the N-channel MOS transistor MN3 can be seen from the output stage, and hence a voltage from about VSS to about VDD can be outputted. In this way, it can be seen that the operational amplifier is constituted as the so-called Rail-to-Rail amplifier. In addition, the outputs (drains) from these differential stages are respectively connected to the first active load 11 having the switch and the second active load 12 having the switch, so that the differential outputs are converted to a single output. It is constituted such that the input and output of the active load 11 having the switch and the second active load 12 having the switch can be switched. A specific circuit constitution will be described below.

The first bias circuit 13 having the switch also includes a circuit for selecting the output terminal of the first active load 11 having the switch and for determining the idling current of the P-channel MOS transistor MP3. Similarly, the second bias circuit 14 having the switch also includes a circuit for selecting the output terminal of the second active load 12 having the switch and for determining the idling current of the N-channel MOS transistor MN3.

Here, it is necessary to design these bias circuits in such a manner that the drain currents (idling currents) of the P-channel MOS transistor MP3 and the N-channel MOS transistor MN3 as described above are equal to each other at the time of no load. Note that it is necessary to control each of the switch states of the first bias circuit 13 having the switch and the second bias circuit 14 having the switch to select one output of each of the first active load 11 having the switch and the second active load 12 having the switch, which output is set as the single end output terminal. As a result, it is assumed that all of these switches are operated in linkage with each other, and are collectively controlled by the offset cancellation control signal input from the offset cancellation control signal terminal 17. It is assumed that at this time, the operational amplifier 1 is controlled so as to be voltage-follower connected as a whole. As the phase compensation circuits 15 and 16, it is possible to use a capacitance single body, a circuit constituted by serially connecting a resistor and a capacitance, and the like, for effecting so-called zero-point compensation, as will be described below.

Next, there is described how the offset voltage of the operational amplifier 1 is changed according to the states of the respective switches in FIG. 1. First, as main causes of generating the offset voltage in the operational amplifier 1, there are listed relative variations in the threshold voltage of the P-channel MOS transistor differential pair constituted by the P-channel MOS transistors MP1 and MP2, relative variations in the threshold voltage of the transistor pair constituting the current mirror circuit acting as the first active load 11 having the switch, relative variations in the threshold voltage of the differential pair of the N-channel MOS transistors constituted by the N-channel MOS transistors MN1 and MN2, and relative variations in the threshold voltage of the transistor pair constituting the current mirror circuit acting as the second active load 12 having the switch.

Assuming that there are two switch states which are respectively set as A and B, and that when the switch state is A, the offset voltage caused by the relative variations in the threshold voltages is sets to Vos, and the noninverting input voltage and the output voltage of the operational amplifier at this time is set to VIN and VO, respectively, then the output voltage is expressed as VO=VIN+Vos. Assuming that next, the switch state is set to B by switching the switches, then the offset voltage having polarity opposite to the polarity at the time when the switch state is A, is output, so that the output voltage is expressed as VO=VIN−Vos. It can be seen from the above that the output voltage VO is output symmetrically with respect to the ideal output voltage value VIN by the switching operation of the switches. Therefore, when the two states of A and B are switched by the switches, the offset voltage is spatially averaged, as a result of which the offset voltage is canceled to be zero.

In the present embodiment, there are provided the switch for switching the noninverting input and the inverting input of each, of the N-channel differential input and the P-channel differential input, the switch for switching the input and output of each of the N-channel differential active load and the P-channel differential active load, and the switch for constituting the feedback loop in which the inverting input terminal and the output terminal are connected to each other in constituting the voltage follower. Thus, it is possible to cancel the offset voltage in time average (spatially cancel the offset) by switching the switches in linkage with each other. Further, by applying this operational amplifier to an LCD driver, it is possible to remarkably improve the characteristic referred to as the deviation which is determined by the offset voltage of the operational amplifier.

Embodiment 2

Figure 2:
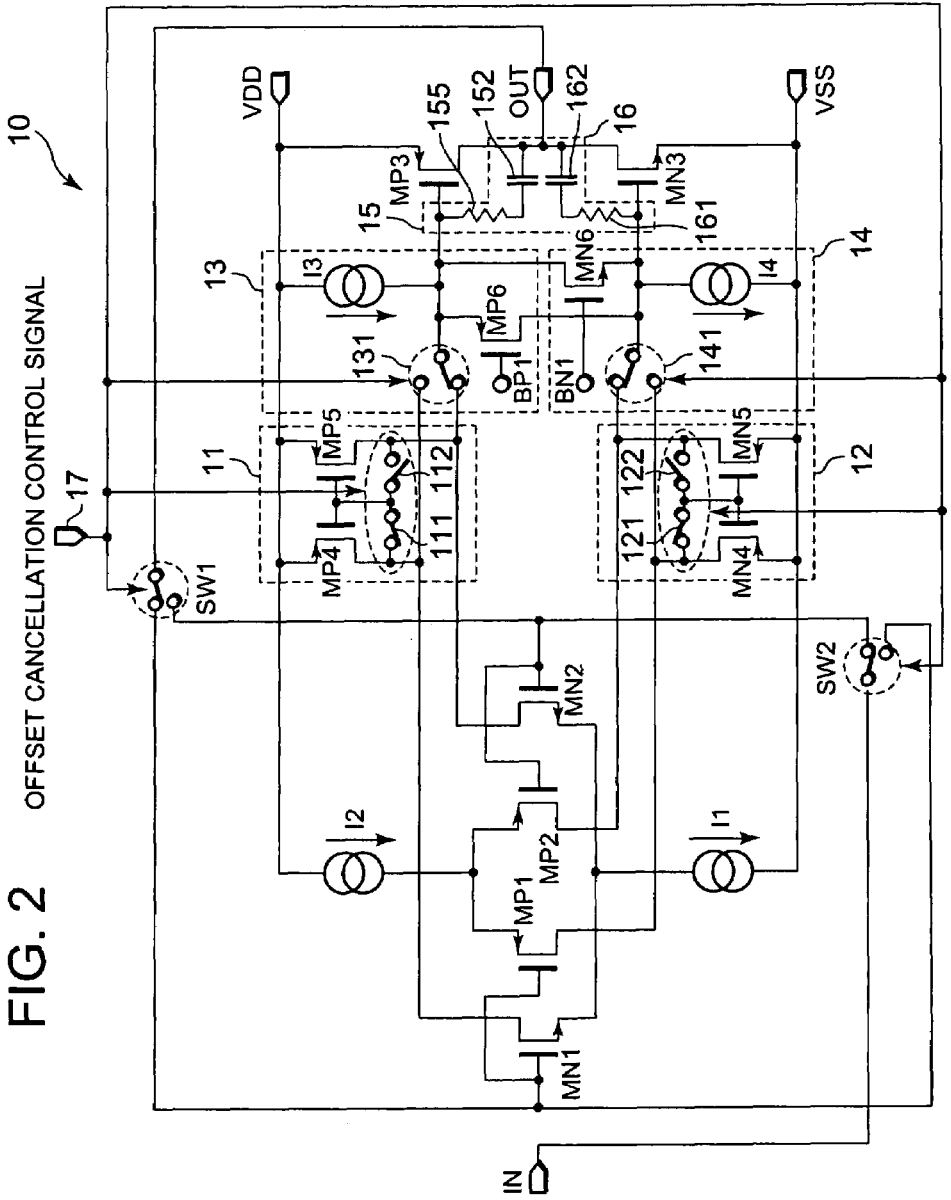
FIG. 2 is a circuit diagram showing an operational amplifier having an offset cancel circuit according to Embodiment 2 of the present invention.

Next, Embodiment 2 according to the present invention will be described. In the present embodiment, the operational amplifier according to the above described Embodiment 1 is more specifically embodied. FIG. 2 is a figure showing an operational amplifier 10 according to the present embodiment. Note that in FIG. 2, the same components as those in FIG. 1 are denoted by the same reference numerals and characters, and the explanation thereof is omitted.

As shown in FIG. 2, a first active load 11 having switches includes two P-channel transistors MP4 and MP5 as a seventh and eighth transistors, whose sources are commonly connected to a positive power source voltage terminal VDD, and whose gates are commonly connected, and switches 111 and 112 as a third and fourth switches, for switching input and output. The switches 111 and 112 are respectively connected between the commonly connected gates and each drain of the P-channel transistors MP4 and MP5, and are also connected in series between the drains.

Further, a second active load 12 having switches includes two N-channel transistors MN4 and MN5 as a ninth and tenth transistors, whose sources are commonly connected to a negative power source voltage terminal, and whose gates are commonly connected, and switches 121 and 122 as a fifth and sixth switches, for switching input and output. The switches 121 and 122 are respectively connected between the commonly connected gates and each drain of the N-channel transistors MN4 and MN5, and are also connected in series between the drains.

Further, a first bias circuit 13 having a switch includes a switch 131 as a seventh switch, a constant current source I3, and a P-channel transistor MP6 as a eleventh transistor. The switch 131 is connected between each drain of the two P-channel transistors MP4 and MP5, and the gate of a P-channel MOS output transistor MP3. The constant current source I3 is connected between the positive power source VDD and the gate of the P-channel MOS output transistor MP3. In the P-channel transistor MP6, the gate is biased by a constant voltage source BP1, the source is connected to the gate of the P-channel MOS output transistor MP3, and the drain is connected to the gate of a N-channel MOS output transistor MN3.

A second bias circuit 14 having a switch includes a switch 141 as an eighth switch, a constant current source I4, and an N-channel transistor MN6 as a twelfth transistor. The switch 141 is connected between each drain of the two N-channel transistors MN4 and MN5, and the gate of the N-channel MOS output transistor MN3. The constant current source I4 is connected between a negative power source and the gate of the N-channel MOS output transistor MN3. In the N-channel transistor MN6, the gate is biased by a constant voltage source BN1, the source is connected to the gate of the N-channel MOS output transistor MN3, and the drain is connected to the gate of the P-channel MOS output transistor MP3.

Further, for the purpose of phase compensation, a phase compensation circuit 15 in which a resistor 151 and a capacitance 152 for zero point introduction are connected in series is connected between the gate and drain of the P-channel MOS output transistor MP3. Further, a phase compensation circuit 16 in which a resistor 161 and a capacitance 162 for zero point introduction are connected in series, is connected between the gate and drain of the N-channel MOS output transistor MN3.

Next, an operation of this operational amplifier 10 will be described. The active load of the first active load 11 having the switches is constituted by a current mirror circuit consisting of the P-channel MOS transistors MP4 and MP5, and also serves as a differential-to-single ended converter. Here, when the switch 111 is set to ON and the switch 112 is set to OFF as shown in FIG. 2, the common connection point of the drain of the P-channel MOS transistor MP5 and the drain of the N-channel MOS transistor MN2 serves as a first output terminal of the input stage. Similarly, the active load of the second active load 12 having the switches is constituted by a current mirror circuit consisting of the N-channel MOS transistors MN4 and MN5, and also serves as a differential-to-single ended converter. Here, when the switch 121 is set to ON, and the switch 122 is set to OFF as shown in FIG. 2, the common connection point of the drain of the N-channel MOS transistor MN5 and the drain of the P-channel MOS transistor MP2 serve as a second output terminal of the input stage.

Next, the respective switches are set to the other states by a switch control signal. That is, as for the switches 111 and 112 of the first active load 11 having the switches, the switch 111 between the gate and drain of the P-channel MOS transistor MP4 is set to OFF, and the switch 112 between the gate and drain of the P-channel MOS transistor MP5 is set to ON. Similarly, as for the switches 121 and 122 of the second active load 12 having the switches, the switch 121 between the gate and drain of the N-channel MOS transistor MN4 is set to OFF, and the switch 122 between the gate and drain of the N-channel MOS transistor MN5 is set to ON. In this state, as for the output of the first active load 11 having the switches, the common connection point of the drain of the P-channel MOS transistor MP4 and the drain of the N-channel MOS transistor MN1 serve as a first output terminal of the input stage. Similarly, the common connection point of the drain of the N-channel MOS transistor MN4 and the drain of the P-channel MOS transistor MP1 serve as a second output terminal of the input stage.

Next, in the switches 131 and 141 of the first bias circuit 13 having the switch and the second bias circuit 14 having the switch, the first and second output terminals of the above described input stage are respectively connected to the gates of the P-channel MOS transistor MP3 and the N-channel MOS transistor MN3 which constitute output transistors. To this end, such operation is performed in linkage with the above described switching of the output nodes of the active load.

Further, the first bias circuit 13 having the switch and the second bias circuit 14 having the switch, determine the current (so-called idling current) which flows through the output transistors of the P-channel MOS transistor MP3 and the N-channel MOS transistor MN3 at the time of no load. Note that here, the P-channel MOS transistor MP6 and the N-channel MOS transistor MN6 constitute a so-called floating current source. In a current source constituted by a general transistor, one end is connected to the power source terminal or the GND terminal, but the floating current source means a current source whose both terminals are in the floating state and can be connected to a free portion. A current feedback with a gain "1" is locally applied in the connection of the P-channel MOS transistor MP6 and the N-channel MOS transistor MN6. Thus, the common connection point of the source of the P-channel MOS transistor MP6 and the drain of the N-channel MOS transistor MN6, and the common connection point of the drain of the P-channel MOS transistor MP6 and the source of N-channel MOS transistor MN6 have high impedance because of the effect of the feedback. That is, a floating current source is constituted by the P-channel MOS transistor MP6 and the N-channel MOS transistor MN6.

Next, the floating current source and the idling current of the P-channel MOS transistor MP3 and the N-channel MOS transistor MN3 are designed as follows. First, the voltage of the constant voltage source (V (BP1)) connected between the positive power, source VDD and the terminal BP1 is equal to the sum of respective voltages between the gate and source of the P-channel MOS transistor MP3 and the P-channel MOS transistor MP6, and hence are expressed as follows.

$$V(BP1) = VGS(MP6) + VGS(MP3) \quad (1)$$

Here, VGS (MP6) denotes a voltage between the gate-source voltage of MP6, and VGS (MP3) denotes the gate-source voltage of MP3.

Further, the gate-source voltage of the P-channel MOS transistor MP3 or the P-channel MOS transistor MP6 is expressed by the following formula. That is:

[Formula 1]

$$V_{GS} = \sqrt{\frac{2I_D}{\beta}} + V_T \quad (2)$$

Here, $\beta = (W/L) \cdot \mu C_0$, W denotes a gate width, L denotes a gate length, $\mu$ denotes mobility, $C_0$ denotes a gate-oxide-film capacitance per unit area, VT denotes a threshold voltage, and, ID denotes a drain current.

First, the floating current source is designed so that the respective drain currents of the P-channel MOS transistor MP6 and the N-channel MOS transistor MN6 are equal to each other. That is, it is designed so that a half (I3/2) of the current source I3 of the current value I3 flows through each of the P-channel MOS transistor MP6 and the N-channel MOS transistor MN6. On the other hand, the idling current (Iidle) is designed as follows on the basis of the above described formula (1), when the drain current of the P-channel MOS transistor MP3 is set to Iidle.

[Formula 2]

$$V_{(BP1)} = \sqrt{\frac{I_3}{\beta_{(MP6)}}} + \sqrt{\frac{2I_{idle}}{\beta_{(MP3)}}} + 2V_T \quad (3)$$

Here, β (MP6) denotes β of the P-channel MOS transistor MP6 and β (MP3) denotes β of the P-channel MOS transistor MP5. Although the detailed circuit of V (BP1) is omitted here, the formula (3) can be solved for Iidle.

Then, it is necessary that the current value of the constant current source I4 is set to be equal to the above described current value of the current source I3. If these current values are different from each other, the difference flows through the active load resulting in the increase in the offset voltage. The voltage of the constant voltage source (V (BN1)) connected between the negative power source VSS and the terminal BP1 is also designed in the completely same manner. The floating constant current source is set as described above.

Here, the constant voltage source (V (BN1)) and the second constant voltage source (V (BP1)) are made strong to component variation when constituted by using two MOS transistors and a constant current source. This is because the same term 2VT is present both in the left side and the right side of the above described formula (3), and hence this term is canceled between the left side and the right side of the formula.

Next, the phase compensation circuits 15 and 16 shown in FIG. 2, which is also used to effect zero point compensation for canceling the phase lag zero point (so-called bad zero point) of the operational amplifier 1, effects phase compensation by the use of a known element in which a capacitance and a resistor are connected in series (see, for example, Paul. R. Gray and Robert. G. Meyer, "Analysis and Design of Analog Integrated Circuits" John Wiley & Sons and Inc.). Further, offset cancel switches SW1 and SW2 are the same as those in the case shown in FIG. 1, and hence the description thereof is omitted.

Next, specific examples for realizing the switch by actual electronic circuits are shown in FIG. 3. Specific examples of a switch 201 shown in FIG. 3(A) are shown in FIG. 3(B) to FIG. 3(D). Further, specific examples of a switch shown in FIG. 3(E) are shown in FIG. 3(F) to FIG. 3(H).

As shown in FIG. 3(B) and FIG. 3(C), the both ends of the make type switch respectively correspond to the drain and source of an N-channel MOS transistor 211 or a P-channel MOS transistor 221. Thus, it is assumed that the control of ON and OFF of the switch is performed by the gate. Here, in the case of the N-channel MOS transistor 211, when the gate is set to the high level, the switch is closed, and when the gate is set to the low level, the switch is opened. In the case of the P-channel MOS transistor 221, the switch is operated vice versa. When the gate is set to the low level, the switch is closed, and when the gate is set to the high level, the switch is opened.

Further, there is shown in FIG. 3(D) a type in which the drains and sources of an N-channel MOS transistor 231 and a P-channel MOS transistor 232 are respectively connected in common to each other in a circuit having the tie-in constitution of the N-channel MOS transistor 231 and the P-channel MOS transistor 232, and their gates are respectively driven by signals of opposite phase generated by using an inverter 233. In this case, when the gate of the N-channel MOS transistor 231 is set to the high level, the gate of the P-channel MOS transistor 232 is set to the low level by the inverter 233, so that both the transistors are turned on. That is, the switch is set to ON.

On the contrary, when the gate of the N-channel MOS transistor 231 is set to the low level, the gate of the P-channel MOS transistor 232 is set to the high level by the inverter 233, so that both the transistors are turned off. That is, the switch is set to OFF.

Further, as shown in FIG. 3(E), in the case of a transfer type switch 241 in FIG. 1 or FIG. 2, the sources of two N-channel MOS transistors 251 and 252 are commonly connected so as to be used as a common terminal of the transfer switch as shown in FIG. 3(F), and the drains of the two N-channel MOS transistors 251 and 252 are used as the make and break terminals, respectively. Then, it is assumed that the respective gates are driven in opposite phase by using an inverter 253. That is, when one gate is set to the high level, the gate of another side is set to the low level.

Further, as shown in FIG. 3(G), a transfer switch using two P-channel MOS transistors 261 and 262 is similarly constituted by commonly connecting the sources of the two P-channel MOS transistors. That is, the sources of the two P-channel MOS transistors 261 and 262 are commonly connected so as to be used as the common terminal of the transfer switch, and the drains of the two P-channel MOS transistors 261 and 262 are used as the make and break terminals, respectively. At this time, it is assumed that the each gate of the two P-channel MOS transistors 261 and 262 are driven in opposite phase by using an inverter 263.

Further, FIG. 3(H) shows a transfer switch in the case where a circuit having the tie-in constitution of N-channel and P-channel MOS transistors is used. The drains of each of two transistor pairs 271 and 272 of an N-channel MOS transistor and a P-channel MOS transistor are respectively connected in common so as to be used as the two transfer side terminals, and the four sources of the MOS transistors are commonly connected so as to be used as the common terminal of the switch. Then, it is assumed that the gates of each MOS transistor pair of the N-channel MOS transistor and the P-channel MOS transistor which are not tied up are commonly connected, and the commonly connected gates are driven in opposite phase by an inverter 273. The operation of this transfer switch is fundamentally the combination of the make and break type switches as described above, and hence the description of the operation of this transfer switch is omitted.

The criteria for determining which of the N-channel MOS transistor, the P-channel MOS transistor or a circuit having the tie-in constitution of the N-channel MOS transistor and the P-channel MOS transistor is used as the switch, is based on the electric potential of the switch. For example, assuming that the power source voltage is set to VDD, when the voltage applied to the switch is higher than about VDD/2, the P-channel MOS transistor is used. On the contrary, when the voltage applied to the switch is lower than VDD/2, the N-channel MOS transistor is used. Further, when the switch needs to be operated in the whole input voltage-range from VSS (GND)

to VDD, the circuit having the tie-in constitution of the N-channel MOS transistor and the P-channel MOS transistor is used.

In the case of FIG. 2, the first and second transfer type switches SW1 and SW2 need to be operated in the whole input voltage range from VSS (GND) to VDD. Thus, it is necessary to use the type shown in FIG. 3(H) as the first and second transfer type switches SW1 and SW2. Further, the switches of the first active load 11 having the switches and the first bias circuit 13 having the switch operate at a potential lower than the voltage of VDD by about 1 to 2 V, and hence the switches using the P-channel MOS transistor shown in FIG. 3(C) and FIG. 3(G) are used. Further, the switches of the second active load 12 having the switches and the second bias circuit 14 having the switch operate at the potential higher than the voltage of VSS (GND) by about 1 to 2 V, and hence the switches using the N-channel MOS transistor shown in FIG. 3(B) and FIG. 3(F) are used.

Also in the present embodiment, the same effect as the above described Embodiment 1 is obtained. That is, the switching of the noninverting input and the inverting input of each of the N-channel differential input and the P-channel differential input, the switching of the input and output of the N-channel differential active load, the switching of the input and output of the P-channel differential active load, and the switching of the feedback loop connecting the inverting input terminal to the output terminal for constituting the voltage follower, are performed by the switches operated in linkage with each other. Thereby, the spatial offset cancellation of the offset voltage can be effected.

Embodiment 3

Next, Embodiment 3 according to the present invention will be described. FIG. 4(A) is a figure showing a case where an operational amplifier according to Embodiment 3 of the present invention is used for an output amplifier of a liquid crystal driver of a liquid crystal display device.

As shown in FIG. 4(A), the output amplifier according to the present embodiment includes voltage-follower connected operational amplifiers AMP11 and AMP12 having an offset cancellation function, and transfer type switch SW11 and switch SW12 for selecting whether an output voltage from a positive side DAC (Digital Analog Converter) or an output voltage from a negative side DAC is received. The operational amplifiers AMP11 and AMP12 are the operational amplifier of Embodiment 1 shown in FIG. 1, or Embodiment 2 shown in FIG. 2. The common terminal side of the switch SW11 is connected to the noninverting input terminal of the operational amplifier AMP11, and the common terminal side of the switch SW12 is connected to the noninverting input terminal of the operational amplifier AMP12. An offset cancellation signal of the operational amplifier AMP11 and the operational amplifier AMP12 is commonly input. The output of the operational amplifier AMP11 is connected to the odd-numbered output, and the output of the operational amplifier AMP12 is connected to the even-numbered output.

Next, an operation of the output amplifier according to the present embodiment will be described. The output amplifier according to the present embodiment is shown by exemplifying certain two outputs from a number of liquid crystal driver outputs. Also, it is assumed that the driving system of liquid crystal is a so-called dot inversion system. When a certain frame is taken as an example and the frame is defined as a first frame, the operational amplifier AMP11 outputs a positive side output voltage, and the operational amplifier AMP12 outputs a negative side output voltage. In the next frame, the operational amplifier AMP11 outputs a negative side output voltage, and the operational amplifier AMP12 outputs a positive side output voltage. This example is an example of a frame signal. But, in the case of dot inversion driving, the switch SW1 and the switch SW2 are switched for each horizontal period, thereby enabling positive and negative outputs to be alternately output.

Thus, the offset cancellation signal is switched at a rate of one time for two frames, as shown in FIG. 4(B). Here, there is an amplitude difference deviation in the deviation standard of LCD driver. The amplitude difference deviation means a difference with other outputs, when the sum of an absolute value of the positive side output and an absolute value of the negative side output is defined as an amplitude. For example, in FIG. 4(B), the amplitude A is a sum of an absolute value a1 of the positive side output (positive side from VCOM), and an absolute value a2 of the negative side output (negative side from VCOM), and the amplitude B is a sum of an absolute value b1 of the positive side output, and an absolute value b2 of the negative side output. Thus, the amplitude difference deviation can be defined as the difference voltage between the amplitude A and the amplitude B. In an actual LCD module, the image quality is determined by the characteristic of the amplitude difference deviation. When the characteristic is deteriorated, there arises a problem in image quality, such as the occurrence of vertical stripes. In this way, in the LCD driver, the amplitude difference deviation characteristic is the most important characteristic.

Here, in the positive side output and the negative side output, the output is performed by the same operational amplifier, and hence, the same offset voltage is naturally generated as shown in FIG. 4(B).

Therefore, in the terms of the amplitude difference deviation as described above, the terms of the offset voltage are canceled by themselves, so that the amplitude A and the amplitude B in FIG. 4(B) theoretically become the same value. In this way, the system is constituted so as to be able to originally cancel the offset. Thus, it is obvious that the term of deviation is further improved by applying the offset cancellation to the system.

Figure 5:
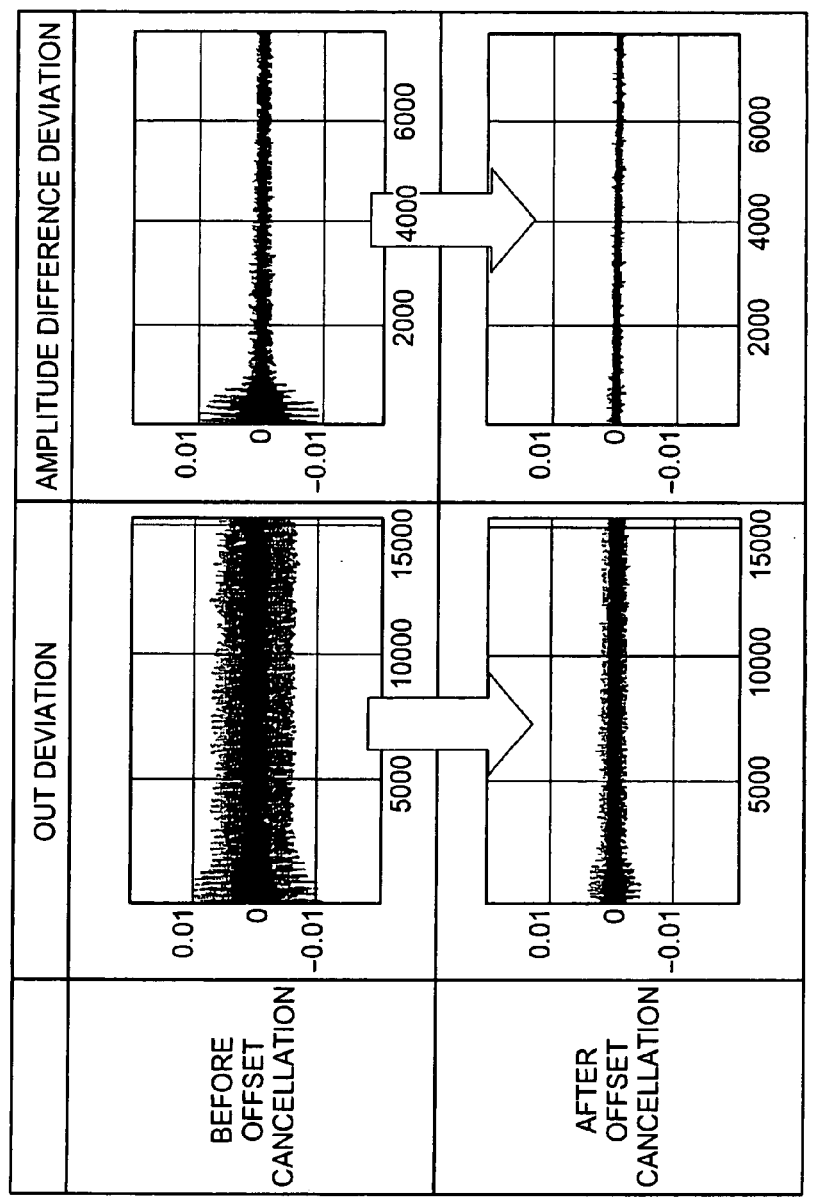
FIG. 5 is a figure showing collected results of deviation data in the LCD driver having the system constitution shown in FIG. 4.
Figure 6:
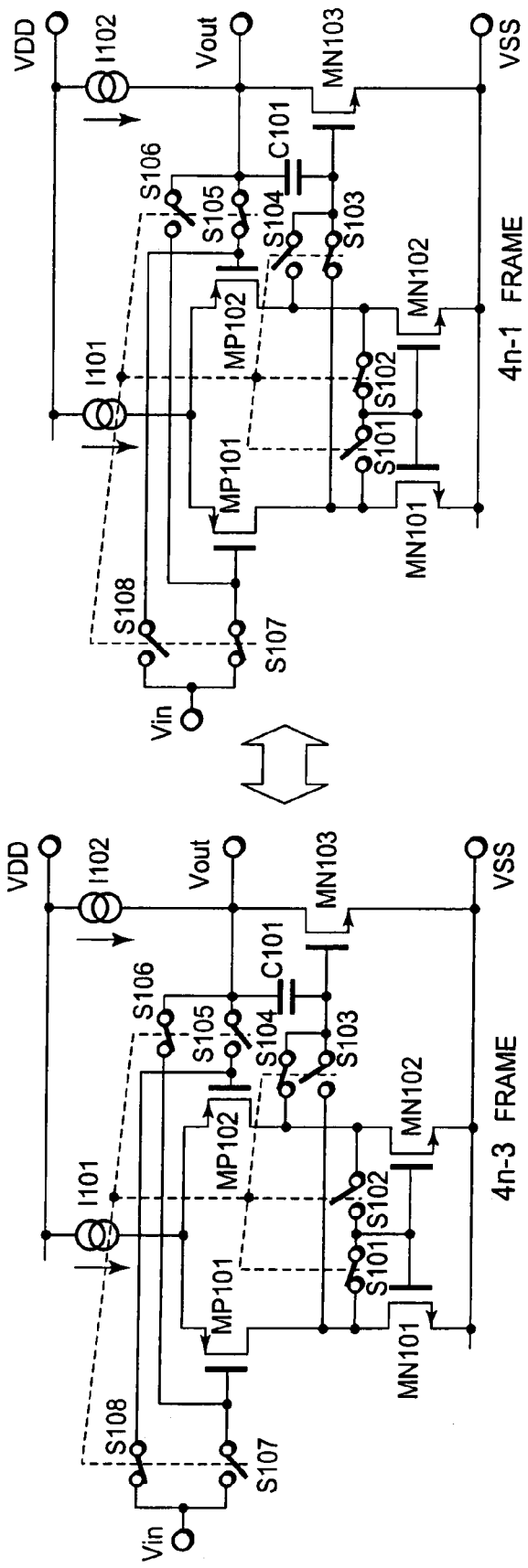
FIG. 6 is a circuit diagram showing an operational amplifier described in Japanese Patent Laid-Open No. 11-249623.
Figure 7:
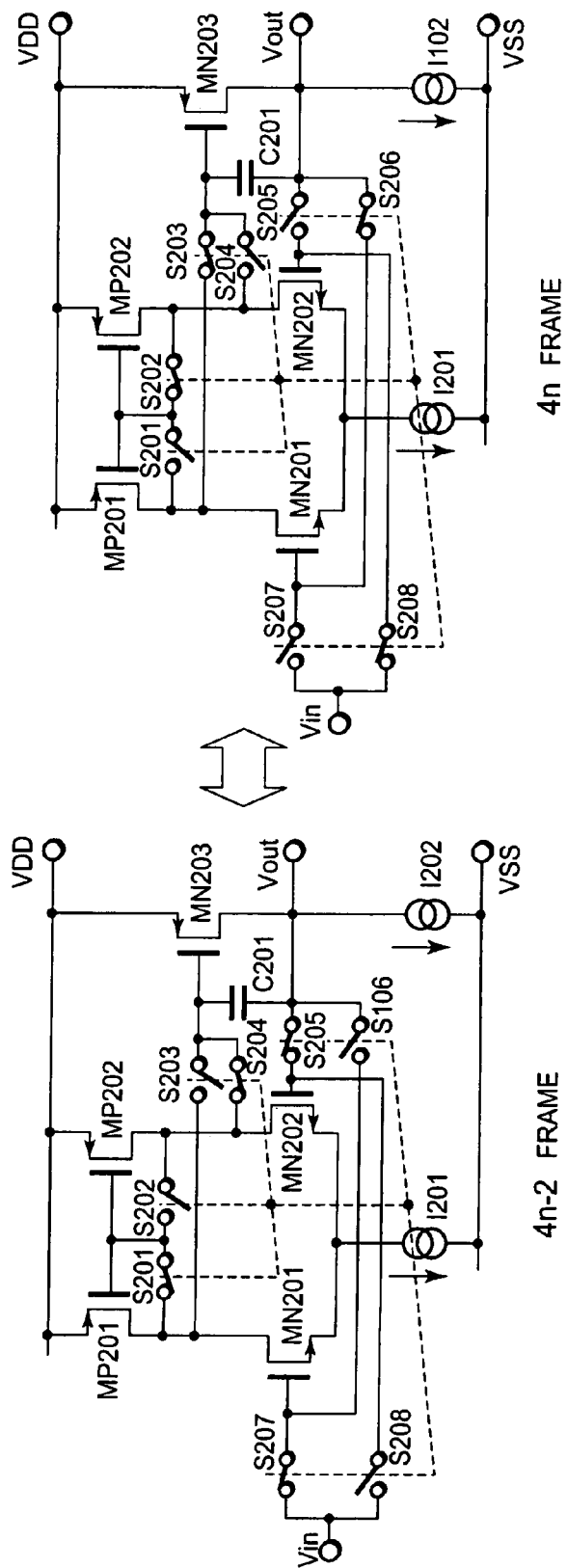
FIG. 7 is similarly a circuit diagram showing the operational amplifier described in Japanese Patent Laid-Open No. 11-249623.
Figure 8A:
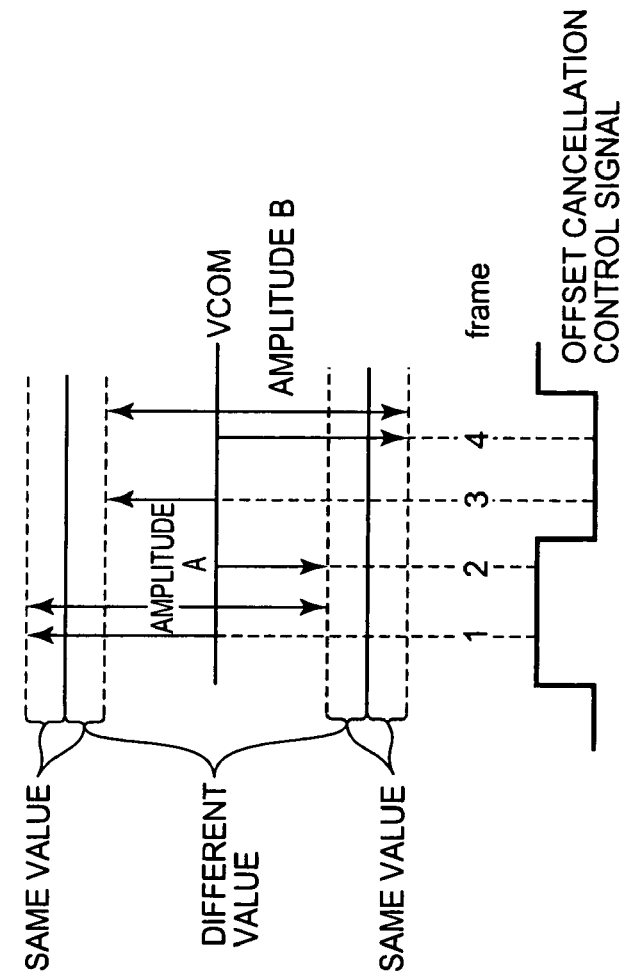
FIG. 8(A) and FIG. 8(B) are figures showing a LCD driver to which the operational amplifiers shown in FIG. 6 and FIG. 7 are applied.
Figure 8B:
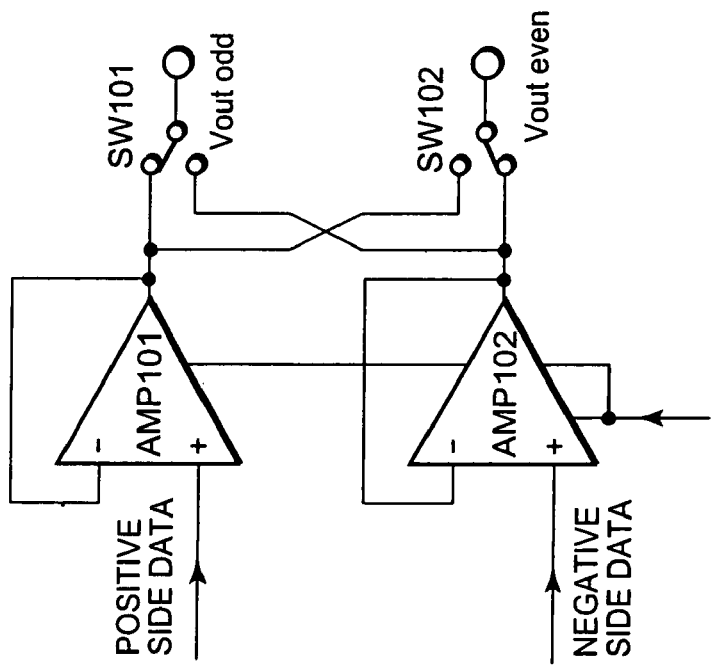
Figure 9:
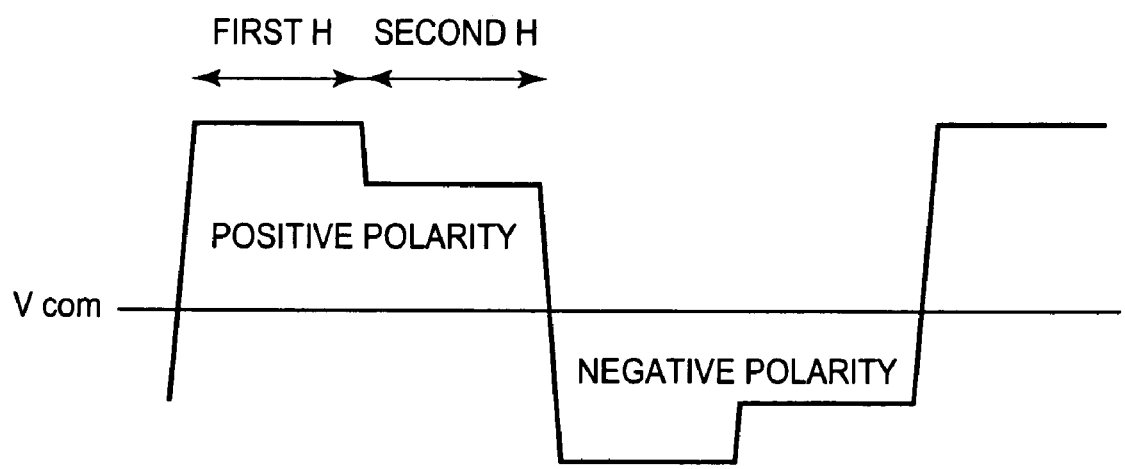
FIG. 9 is a figure showing a general output drive waveform of the 2H inversion driving method.

FIG. 5 is a figure showing a collected result of deviation data in the LCD driver having the system constitution shown in FIG. 4. In FIG. 5, the horizontal axis represents the number of outputs×gradation of the LCD driver, and the vertical axis represents the voltage value indicating the deviation. When the horizontal axis is expanded here, strip-shaped parts corresponding to the number of outputs of the LCD driver are shown. As shown in FIG. 5, it can be seen that both the output deviation and the amplitude difference deviation are remarkably reduced after the offset cancellation is applied.

The present embodiment is characterized in that in the driving system of so-called one amplifier system, for driving the LCD driver adapted to drive the positive side polarity and the negative side polarity with one amplifier (operational amplifier) by the use of the Rail-to-Rail amplifier, the spatial offset cancellation is applied to the amplifier. To this end, in the Rail-to-Rail amplifier, there are provided a switch adapted to switch the noninverting input and the inverting input of each of the N-channel differential input and the P-channel differential input, a switch adapted to switch input and output of each of the N-channel differential active load and the P channel differential active load, and a selection switch for constituting a feedback loop in which the inverting input terminal and the output terminal are connected to each other to constitute the voltage follower, so that a spatial offset cancel circuit is realized by making the switches operated in linkage with each other.

Here, the operational amplifier according to the present embodiment is particularly suitable for an output amplifier of an LCD source driver, or an operational amplifier used for a gradation power source circuit for determining gamma correction in the field of video. For these operational amplifiers, a circuit having an extremely small offset voltage is required, and hence the offset cancellation needs to be effected by certain means. To this end, in the present embodiment, the spatial offset cancel circuit which is a Rail-to-Rail type operational amplifier is realized by a simple circuit constitution. Further, it is possible to remarkably improve the most important characteristic referred to as the deviation by adopting this operational amplifier as the output amplifier of the so-called LCD driver system of one AMP system.

Note that it is obvious that the present invention is not limited to the above described embodiments but various variations are possible within the scope and spirit of the present invention.

What is claimed is:

1. An operational amplifier comprising:
   a first differential pair having a first transistor and a second transistor of a first conductivity type;
   a second differential pair having a third transistor and a fourth transistor of a second conductivity type;
   an output stage having a fifth transistor and a sixth transistor;
   a first active load having two outputs and a switch, adapted to convert differential outputs from the first differential pair to a single output on either one of said outputs thereof;
   a second active load having two outputs and a switch, adapted to convert differential outputs from the second differential pair to a single output on either one of said outputs thereof;
   a first bias circuit having a switch, adapted to select one of two outputs of the first active load to bias the fifth transistor;
   a second bias circuit having a switch, adapted to select one of two outputs of the second active load to bias the sixth transistor;
   a first switch adapted to couple output terminal of said output stage to one of control terminals of each of the first and second differential pairs;
   a second switch adapted to couple an input terminal to another of control terminals of each of the first and second differential pairs.

2. The operational amplifier according to claim 1, further comprising:
   in the first active load, seventh and eighth transistors of the second conductivity type, whose sources are commonly coupled to a first power source, and whose gates are commonly coupled; and third and fourth switches respectively coupled between the commonly coupled gates of the seventh and eighth transistors and each drain of the seventh and eighth transistors, and
   in the second active load, ninth and tenth transistors of the first conductivity type, whose sources are commonly coupled to a second power source, and whose gates are commonly coupled; and fifth and sixth switches respectively coupled between the commonly coupled gates of the ninth and tenth transistors and each drain of the ninth and tenth transistors.

3. The operational amplifier according to claim 2,
   wherein the first bias circuit comprises: a seventh switch coupled between one of drains of the seventh and eighth transistors, and the gate of the fifth transistor; a first constant current source coupled between a voltage source and the gate of the fifth transistor; and an eleventh transistor whose gate is biased by a first reference voltage, whose source is coupled to the gate of the fifth transistor, and whose drain is coupled to the gate of the sixth transistor, and
   wherein the second bias circuit comprises: an eighth switch coupled between one of drains of the ninth and tenth transistors, and the gate of the sixth transistor; a second constant current source coupled between another voltage source and the gate of the sixth transistor; and a twelfth transistor whose gate is biased by a second reference voltage, whose source is coupled to the gate of the sixth transistor, and whose drain is coupled to the gate of the fifth transistor.

4. The operational amplifier according to claim 1, wherein first and second phase compensation circuits are coupled to control terminals of the fifth and sixth transistors, respectively.

5. The operational amplifier according to claim 4, wherein the first and second phase compensation circuits each comprises a serial connection of a resistor and a capacitance, and are respectively coupled between the gate and drain of the fifth transistor, and between the gate and drain of the sixth transistor.

6. The operational amplifier according to claim 1, wherein said first and second switches operate synchronously with said switches in said first and second active loads and the first and second bias circuits.

7. A display device comprising:
   a first operational amplifier coupled to an odd-numbered output;
   a second operational amplifier coupled to an even-numbered output and adapted to receive an offset cancellation signal common to the first operational amplifier;
     an input switch having two inputs to respectively receive two input signals, said input signals having polarity thereof opposite to each other, said input switch operating to couple each of said two input signals to either one of the first and second operational amplifiers;
   wherein each of the first and second operational amplifiers includes:
   a first differential pair having a first transistor and a second transistor of a first conductivity type;
   a second differential pair having a third transistor and a fourth transistor of a second conductivity type;
   an output stage having a fifth transistor and a sixth transistor;
   a first active load having two outputs and a switch, adapted to convert differential outputs from the first differential pair to a single output on either one of said outputs thereof;
   a second active load having two outputs and a switch, adapted to convert differential outputs from the second differential pair to a single output on either one of said outputs thereof;
   a first bias circuit having a switch, adapted to select one of two outputs of the first active load to bias the fifth transistor;
   a second bias circuit having a switch, adapted to select one of two outputs of the second active load to bias the sixth transistor;
   a first switch adapted to couple an output terminal of said output stage to one of control terminals of each of the first and second differential pairs; and
   a second switch adapted to couple an input terminal to another of control terminals of each of the first and second differential pairs.

8. The operational amplifier according to claim 7, wherein said first and second switches operate synchronously with said switches in said first and second active loads and the first and second bias circuits.

9. An operational amplifier, comprising:
a first differential pair including at least a first transistor of a first conductivity type to output a first output and a second output, said first differential pair including a first control terminal and a second control terminal;
a second differential pair including a second transistor of a second conductivity type to output a third output and a fourth output, said second differential pair including a first control terminal and a second control terminal;
an output stage including an output terminal;
a first circuit receiving the first and second outputs to selectively output one of the first and second outputs, in order to apply the selected one of said first and second outputs to said output stage;
a second circuit receiving the third and fourth outputs to selectively output one of said third and fourth outputs, in order to apply the selected one of said third and fourth outputs to said output stage;
a first switch which couples said output terminal to said first control terminals of the first and second differential pairs when a control signal indicates a first mode; and
a second switch which couples an input terminal to said second control terminals of the first and second differential pairs when said control signal indicates said first mode.

10. The operational amplifier as claimed in claim 9,
wherein said output stage comprises a third transistor and a fourth transistor connected in series, said third transistor is of said second conductivity type and receives the output from said first circuit, said fourth transistor is of said first conductivity type and receives the output from said second circuit, said output terminal is placed at a connecting node between said third and fourth transistors.

11. The operational amplifier as claimed in claim 9,
wherein said first switch couples said output terminal to said second control terminals of the first and second differential pairs when said control signal indicates a second mode, and
wherein said second switch couples said input terminal to said first control terminals of the first and second differential pairs when said control signal indicates said second mode.

12. The operational amplifier as claimed in claim 11,
wherein said first circuit comprises a first active load which receives said first and second outputs and transfers said first and second outputs to first and second output nodes thereof, respectively, while changing a load state according to said control signal.

13. The operational amplifier as claimed in claim 12,
wherein said first circuit comprises a bias circuit which selects one of said first and second output nodes from said first active load to connect the selected node to said output stage, based on said control signal.

* * * * *